United States Patent [19]
Watanabe

[11] Patent Number: 5,258,639
[45] Date of Patent: Nov. 2, 1993

[54] SEMICONDUCTOR MEMORY DEVICE HAVING MULTILAYER WIRING STRUCTURE

[75] Inventor: Tatsuhiro Watanabe, Kawasaki, Japan

[73] Assignee: Fujitsu Limited, Kanagawa, Japan

[21] Appl. No.: 971,131

[22] Filed: Nov. 4, 1992

[30] Foreign Application Priority Data

Nov. 5, 1991 [JP] Japan .................................. 3-288960
Oct. 29, 1992 [JP] Japan .................................. 4-291362

[51] Int. Cl.$^5$ ..................... H01L 27/02; H01L 27/10; H01L 23/48; H01L 29/46
[52] U.S. Cl. .................................... 257/401; 257/296; 257/390; 257/773
[58] Field of Search ............... 257/401, 296, 390, 758, 257/773, 786, 905, 909

Primary Examiner—Mark V. Prenty
Attorney, Agent, or Firm—Nikaido, Marmelstein, Murray & Oram

[57] ABSTRACT

A semiconductor memory device includes respective regions of a column decoder and a sense amplifier drive circuit arranged to lie opposite to each other on a semiconductor chip, respective regions of a memory cell array, a column gate and a sense amplifier arranged between the regions of the column decoder and the sense amplifier drive circuit, a plurality of column selection lines led out from the region of the column decoder, connected to respective column gate portions of the region of the column gate, and collected and arranged with units of groups of a predetermined number above the region of the column gate so as to have a smaller arrangement pitch than that of the column gate portion, and at least one sense amplifier drive signal line led out from the region of the sense amplifier drive circuit, connected to respective sense amplifier portions of the region of the sense amplifier, and arranged above the region of the sense amplifier so as to lie next to each group of the column selection lines. By the constitution, it is possible to constitute the memory device without any problem or difficulty from a viewpoint of the layout thereof even if it is a large capacity memory such as a 16 M-bit DRAM.

9 Claims, 8 Drawing Sheets

SEMICONDUCTOR MEMORY DEVICE HAVING MULTILAYER WIRING STRUCTURE

BACKGROUND OF THE INVENTION

1. Field of the Invention

The present invention relates to a semiconductor memory device. More particularly, it relates to a layout of sense amplifier (S/A) drive signal lines and column selection lines in a large capacity memory such as a 16 M-bit dynamic random access memory (DRAM).

2. Description of the Related Art

Semiconductor memory devices are generally constituted in the form of a semiconductor chip which typically has a rectangular form. In this regard, it is necessary to devise a configuration of layout of a S/A drive circuit from which S/A drive signal lines are led out, and a column decoder from which column selection lines are led out, according to a memory capacity. Especially, since the S/A drive signal lines carry a large amount of current for driving sense amplifiers, wiring widths thereof must be selected to be sufficiently wide.

In view of this, it is desirable to provide the S/A drive circuit in a periphery of a longer side of the semiconductor chip and accordingly arrange the S/A drive signal lines along a direction parallel to a direction of a shorter side thereof. Such a configuration of layout is suitable for a relatively small capacity memory such as a 4 M-bit DRAM.

However, the above configuration of layout is not suitable for a relatively large capacity memory such as a 16 M-bit DRAM which has been recently developed. This is because the S/A drive circuit needs a considerable large area on the chip and thus it is very difficult to arrange the S/A drive circuit in the periphery of the longer side of the semiconductor chip, from a viewpoint of the layout.

Note, the problems in the prior art will be explained later in detail in contrast with the preferred embodiments of the present invention.

SUMMARY OF THE INVENTION

An object of the present invention is to provide a semiconductor memory device which can be constituted without any problem or difficulty from a viewpoint of the layout thereof even if it is a large capacity memory such as a 16 M-bit DRAM.

According to the present invention, there is provided a semiconductor memory device including: a region of a column decoder arranged on a semiconductor chip; a region of a sense amplifier drive circuit arranged to lie opposite the region of the column decoder on the semiconductor chip; respective regions of a memory cell array, a column gate, and a sense amplifier driven by the sense amplifier drive circuit, respectively, arranged between the region of the column decoder and the region of the sense amplifier drive circuit; a plurality of column selection lines led out from the region of the column decoder, connected to respective column gate portions of the region of the column gate, and collected and arranged with units of groups of a predetermined number above the region of the column gate so as to have a smaller arrangement pitch than that of the column gate portion; and at least one sense amplifier drive signal line led out from the region of the sense amplifier drive circuit, connected to respective sense amplifier portions of the region of the sense amplifier, and arranged above the region of the sense amplifier so as to lie next to each group of the column selection lines.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Throughout the description, identical references used in connection with the drawings indicate like constituent elements and thus the repetition of explanation thereof is omitted.

First, for a better understanding of the preferred embodiment of the present invention, the related prior art will be explained with reference to FIGS. 1 and 2.

Figure 1:
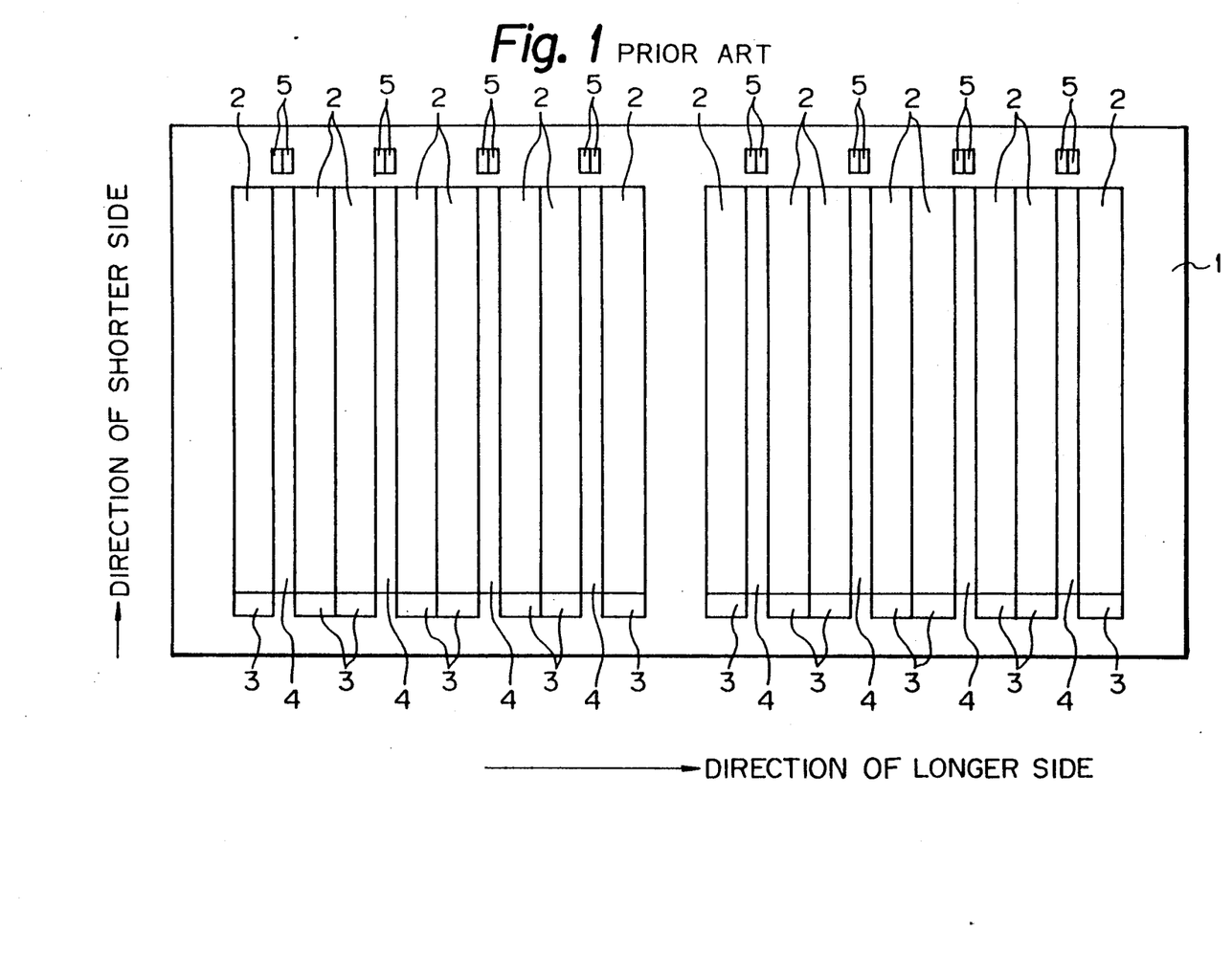
FIG. 1 is a plan view schematically showing a constitution of a prior art DRAM.

FIG. 1 schematically illustrates a constitution of a prior art DRAM.

The illustrated example shows a configuration of layout of a DRAM with 4 M-bit capacity. In the illustration, reference 1 denotes a semiconductor chip and reference 2 denotes a memory cell array (region) with 256 K-bit capacity. Reference 3 denotes a row decoder (region) for decoding row addresses of an input address signal and selecting one word line in the corresponding memory cell array 2. Also, a region indicated by reference 4 includes a column decoder (region) for decoding column addresses of the input address signal and selecting one or one pair of bit lines in the corresponding memory cell array 2, a column gate (region) controlled by the column decoder, for connecting the selected bit lines to the corresponding data bus, and a sense amplifier (region) for sensing and amplifying data read out from a selected memory cell. Reference 5 denotes a sense amplifier (S/A) drive circuit (region) for driving the corresponding sense am plifier.

Figure 2:
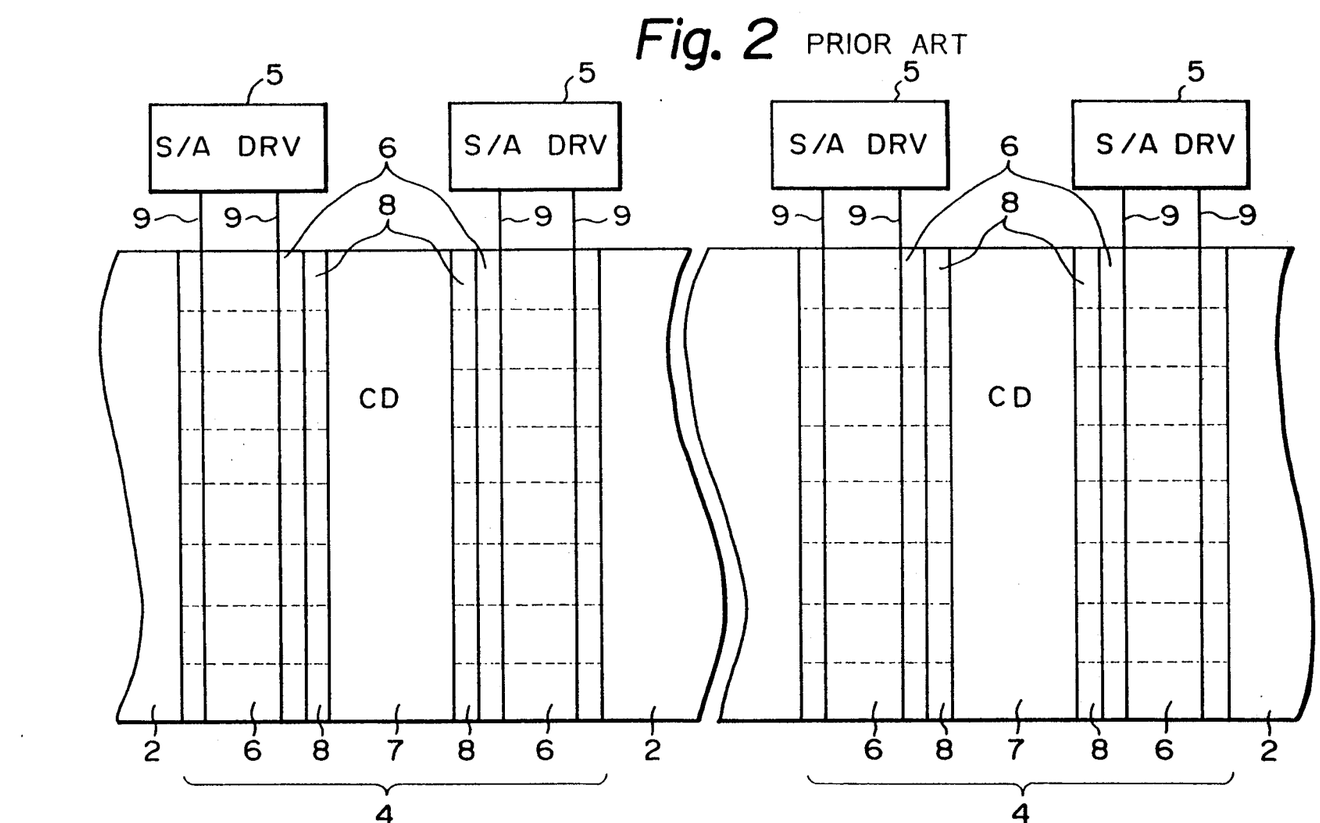
FIG. 2 is an enlarged plan view showing a constitution of the main parts in FIG. 1.

FIG. 2 illustrates a constitution of the main parts in FIG. 1 in an enlarged form. In the illustration, reference 6 denotes a sense amplifier (region); reference 7 a column decoder (region); reference 8 a column gate (region); and reference 9 a sense amplifier (S/A) drive signal line for feeding a S/A drive signal output from the corresponding S/A drive circuit 5 to the corresponding sense amplifier 6.

Thus, in the layout of FIGS. 1 and 2, the S/A drive circuit 5 is arranged in a periphery of a longer side of the semiconductor chip 1.

Although the above configuration of layout poses no problem where a memory capacity is relatively small such as 4 M-bit as described above, it poses a problem with respect to a relatively large capacity memory such as a 16 M-bit DRAM which has been recently developed. Namely, since the S/A drive circuit needs a considerable large area on the chip, a problem occurs in that, from a viewpoint of the layout, it is very difficult to arrange the S/A drive circuit in the periphery of the longer side of the chip (as shown in FIG. 1) in a large capacity memory such as a 16 M-bit DRAM.

Figure 3:
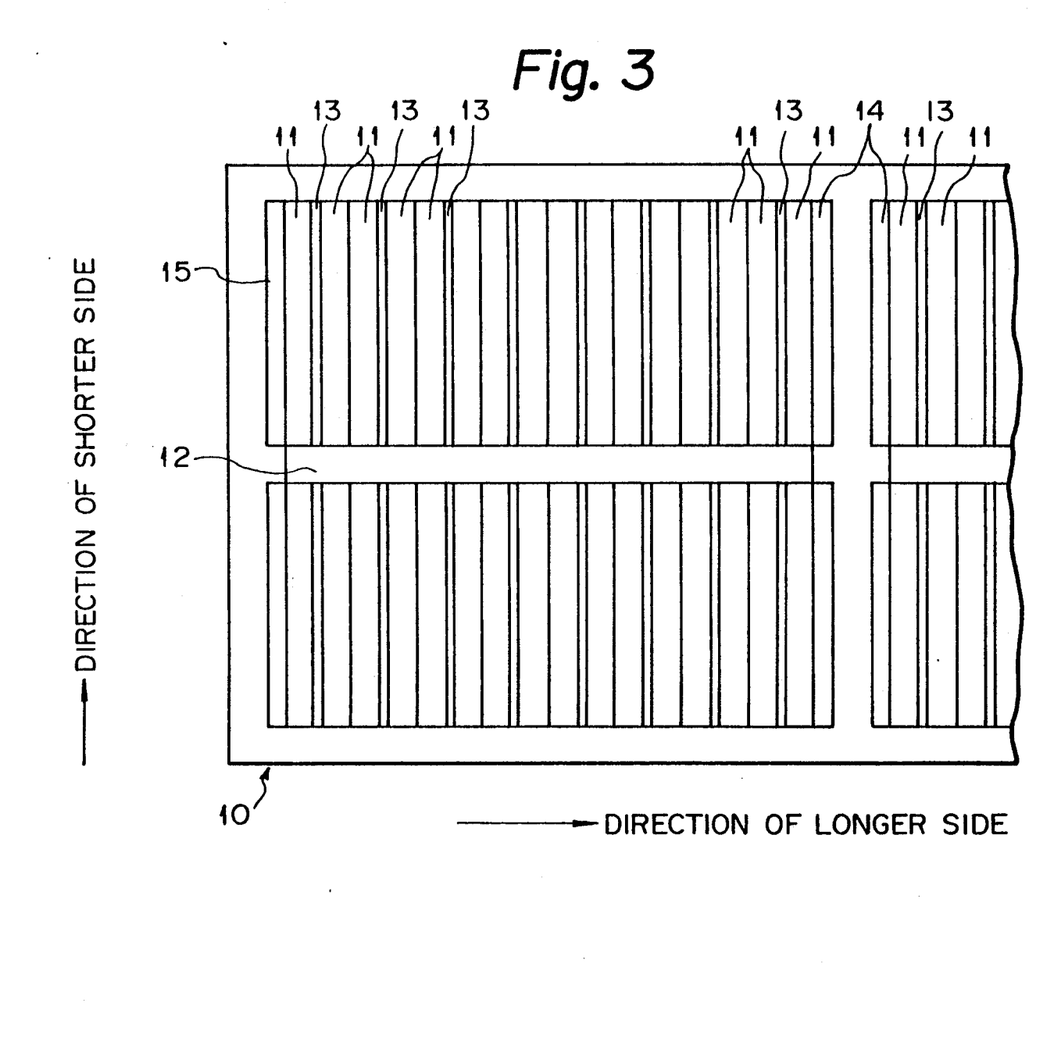
FIG. 3 is a plan view schematically showing a constitution of a DRAM which has been recently developed.

To cope with this disadvantage, such a large capacity DRAM may be constituted, for example, with a configuration of layout as shown in FIG. 3.

The illustration of FIG. 3 shows a configuration of layout of a DRAM with 16 M-bit capacity. In the illustration, reference 10 denotes a semiconductor chip; reference 11 a memory cell array (region) with 256 K-bit capacity; reference 12 a row decoder (region); reference 13 a region including sense amplifiers and column gates; reference 14 a column decoder (region); and reference 15 a sense amplifier (S/A) drive circuit (region).

Figure 4:
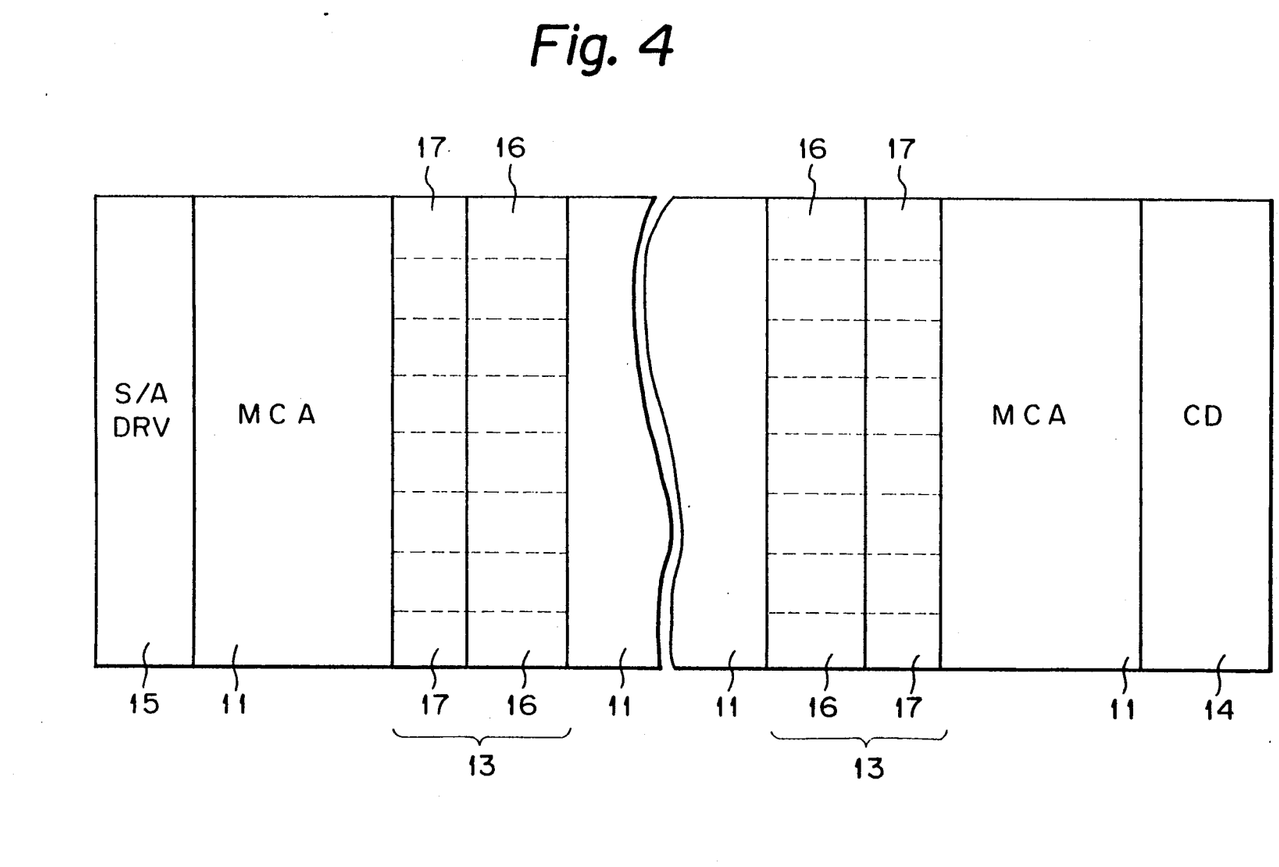
FIG. 4 is an enlarged plan view showing a constitution of the main parts in FIG. 3.

FIG. 4 illustrates a constitution of the main parts in FIG. 3 in an enlarged form. In the illustration, reference 16 denotes a sense amplifier (region) and reference 17 denotes a column gate (region).

Thus, in the layout of FIGS. 3 and 4, the S/A drive circuit 15 is arranged to lie opposite to the column decoder 14 in a periphery of a shorter side of the semiconductor chip 10.

Figure 5:
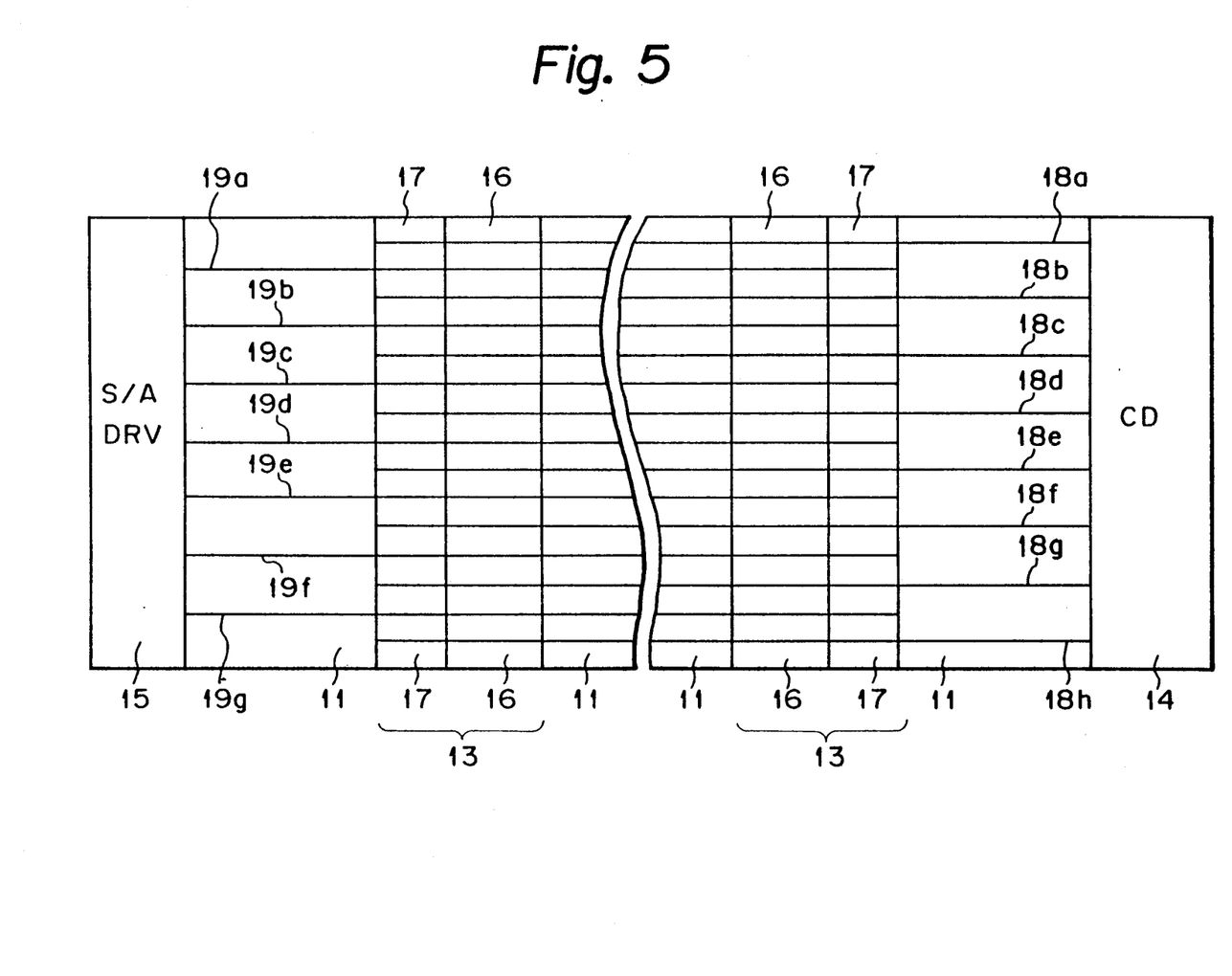
FIG. 5 is a plan view showing an example of wiring which poses a problem in the constitution of FIG. 4.

In this case, as shown in FIG. 5, where column selection lines 18a to 18h led out from the column decoder 14 are arranged with a pitch equal to an arrangement pitch of a respective column gate 17, S/A drive signal lines 19a to 19g led out from the S/A drive circuit 15 must be arranged between each column selection line 18a to 18h respectively.

However, such a layout of signal lines poses a problem. Namely, since the S/A drive signal lines 19a to 19g carry a large amount of current for driving sense amplifiers, respective wiring widths must be selected to be as wide as possible. In particular, where a memory capacity is increased, a condition for the selection of wiring widths in the layout becomes severe because the number of sense amplifiers is also accordingly increased. In view of this, a problem still remains left in that it is difficult to always realize the wiring layout shown in FIG. 5, i.e., the S/A drive signal lines are arranged between each column selection line.

Next, the preferred embodiment of the present invention will be explained with reference to FIGS. 6 to 8.

Figure 6:
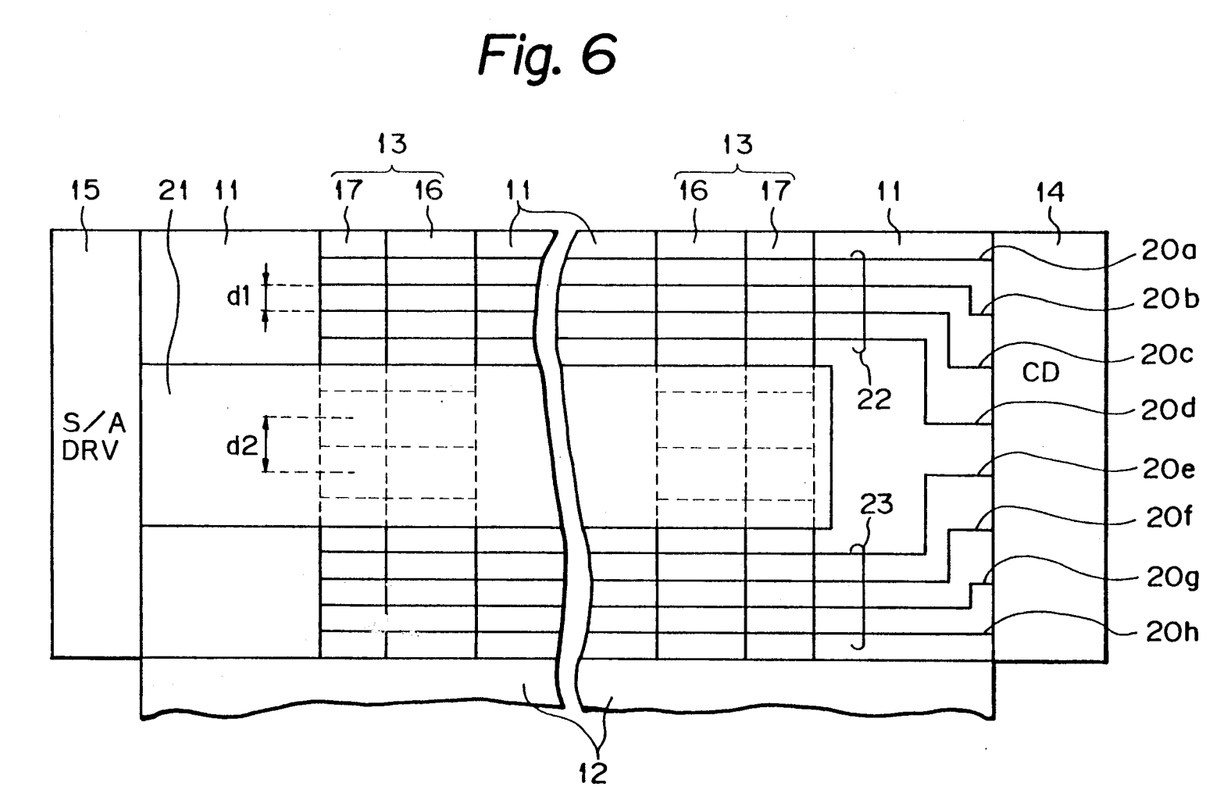
FIG. 6 is a plan view showing a constitution of the main parts of the DRAM according to an embodiment of the present invention.

FIG. 6 illustrates a constitution of the main parts of the DRAM according to an embodiment of the present invention.

The illustration of FIG. 6 shows a configuration of layout of a sense amplifier (S/A) drive signal line and column selection lines in the case that a 16 M-bit DRAM is constituted as shown in FIGS. 3 and 4, i.e., in the case that the column decoder (region) 14 and the S/A drive circuit (region) 15 are arranged to lie opposite to each other and the respective regions of the memory cell array 11, the sense amplifier 16 and the column gate 17 are arranged between each region of the column decoder 14 and the S/A drive circuit 15. In the illustration, references 20a to 20h denote the column selection lines led out from the column decoder 14, and reference 21 denotes the S/A drive signal line led out from the S/A drive circuit 15.

In the present embodiment, the column selection lines 20a to 20h are separated into two groups, i.e., a group 22 (column selection lines 20a to 20d) and a group 23 (column selection lines 20e to 20h), and collected and arranged with units of each group.

In this case, in the group 22 (column selection lines 20a to 20d) and the group 23 (column selection lines 20e to 20h), the layout of wiring is carried out such that the pitch d1 of respective signal wirings is narrower than the arrangement pitch d2 of respective column gate portions of the column gate 17. As a result, a space with a relatively large width is ensured between the groups 22 and 23, i.e., between the column selection line 20d and the column selection line 20e. The S/A drive signal line 21 is arranged in the space.

Thus, according to the DRAM of the present embodiment, even if the S/A drive circuit 15 is arranged in the periphery of the shorter side of the semiconductor chip 10 as shown in FIGS. 3 and 4, it is possible to form the S/A drive signal line 21 with a sufficiently wide wiring width. As a result, the S/A drive signal line 21 can feed a large amount of current to the sense amplifier 6. Therefore, it is possible to constitute the 16 M-bit DRAM without causing any problem or difficulty as seen in the prior art, from a viewpoint of the layout.

Figure 7:
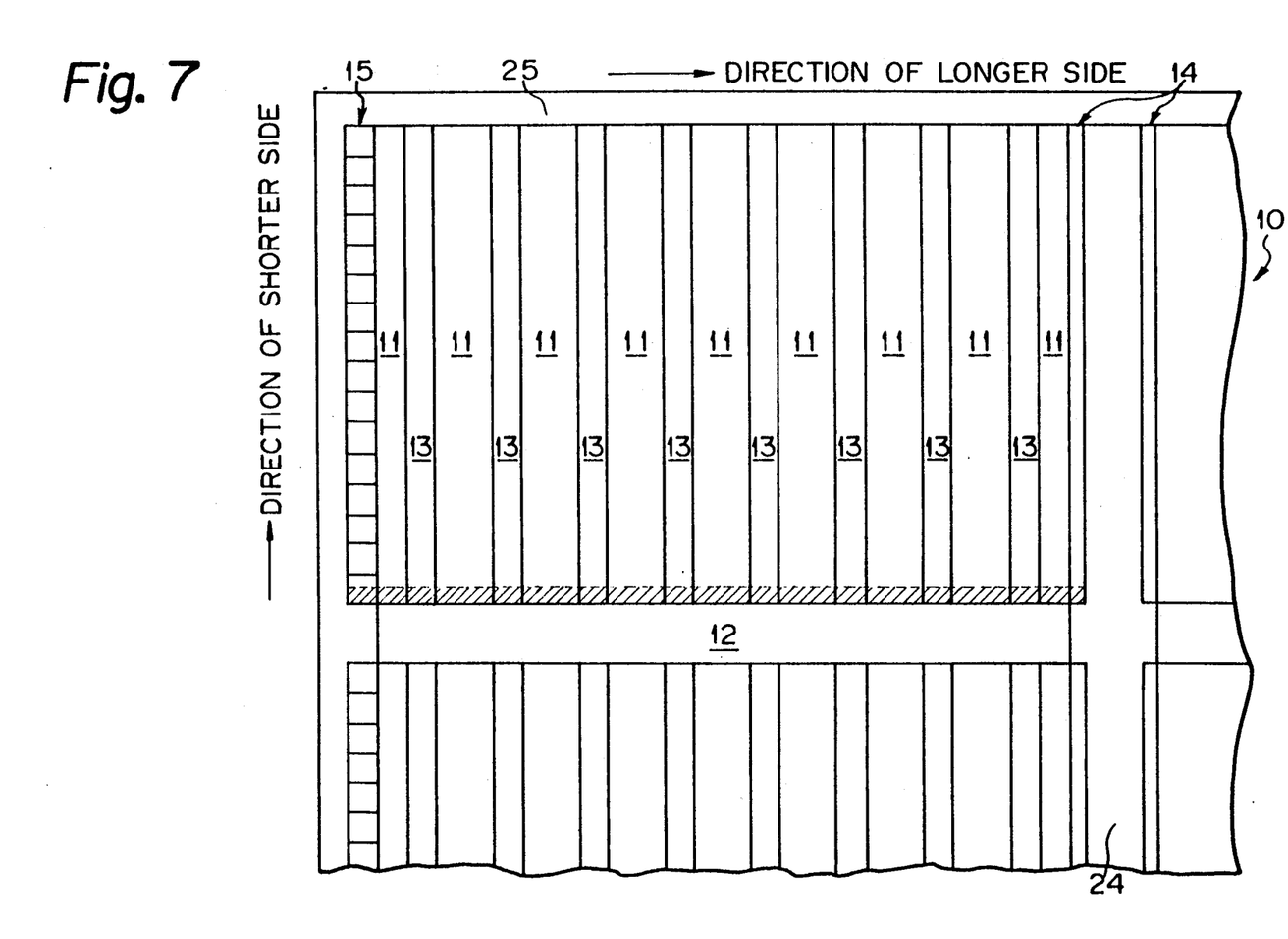
FIG. 7 is a plan view schematically showing a constitution of the DRAM shown in FIG. 6.

FIG. 7 schematically illustrates a constitution of the DRAM shown in FIG. 6.

In FIG. 7, the hatched portion corresponds to the constitution of FIG. 6. As is obvious by contrast of FIG. 7 with FIG. 6, the S/A drive circuit (region) 15 and the column decoder (region) 14 are arranged to lie opposite to each other with respect to a direction of a longer side of the semiconductor chip 10 and provided in a rectangular form, respectively, along a direction parallel to a direction of a shorter side thereof. Also, the column selection lines 20a to 20h and the S/A drive signal line 21 are arranged, respectively, along a direction parallel to the direction of the longer side of the semiconductor chip 10. Note, reference 24 denotes a peripheral circuit (region) including a clock generator for generating internal timing signals for use of data write operation and data read operation, and reference 25 denotes a peripheral circuit (region) including an input/output circuit, a redundant circuit, and the like.

The DRAM of the present embodiment has the form of the semiconductor chip 10 with a two-layer structure of aluminum wiring. An example of the structure is shown in FIG. 8.

Figure 8:
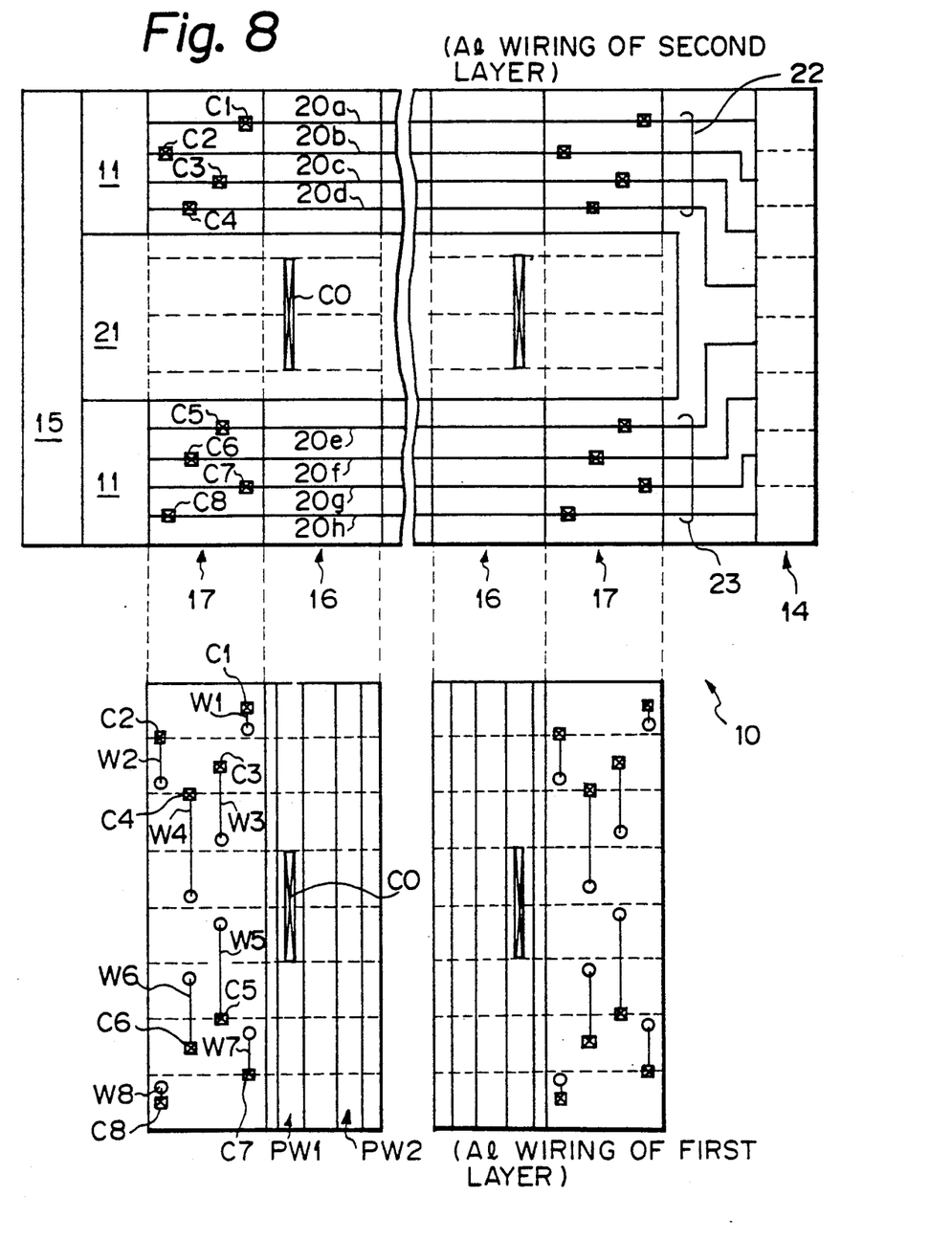
FIG. 8 is a plan view showing that the DRAM of FIG. 6 includes a two-layer wiring structure.

In FIG. 8, the wiring of a second layer of upper side corresponds to the constitution of FIG. 6. The wiring of a first layer of lower side is provided for electrically connecting each signal line provided in the second layer to the underlying semiconductor substrate (not shown).

In the first layer, two power supply lines PW1 and PW2 are arranged along the direction parallel to the direction of the shorter side of the semiconductor chip 10 in a region corresponding to the sense amplifier (region) 16. One is a lower voltage power supply line PW1 to be connected to the side of N-channel transistors (not shown), and another is a higher voltage power supply line PW2 to be connected to the side of P-channel transistors (not shown). The power supply line PW1 is electrically connected via a contact hole C0 to the S/A drive signal line 21 provided in the second layer. Also, eight wirings W1 to W8 are arranged along the direction parallel to the direction of the shorter side of the semiconductor chip 10 in a region corresponding to the column gate (region) 17. Each of the wirings W1 to W8 is electrically connected via a corresponding contact hole C1 to C8 to the respective column selection lines 20a to 20h provided in the second layer.

Although the present invention has been disclosed and described by way of a single embodiment, it is apparent to those skilled in the art that other embodiments and modifications of the present invention are possible without departing from the spirit or essential features thereof.

I claim:

1. A semiconductor memory device comprising:
 a region of a column decoder arranged in a first surface of a semiconductor chip along a side thereof;
 a region of a sense amplifier drive circuit arranged on said first surface of said semiconductor chip on a side which is opposite to the region of the column decoder on the semiconductor chip;
 respective regions of a memory cell array, a column gate, and a sense amplifier driven by the sense amplifier drive circuit, respectively, arranged between the region of the column decoder and the region of the sense amplifier drive circuit;
 a plurality of column selection lines led out from the region of the column decoder, connected to respective column gate portions of the region of the column gate, and collected and arranged with units of groups of a predetermined number of above the region of the column gate so as to have a smaller arrangement pitch than that of the column gate portions; and
 at least one sense amplifier drive signal line led out from the region of the sense amplifier drive circuit, connected to respective sense amplifier portions of the region of the sense amplifier, and arranged above the region of the sense amplifier so as to lie next to each group of the column selection lines.

2. A semiconductor memory device as set forth in claim 1, wherein the semiconductor chip has a two-layer wiring structure and the plurality of column selection lines and the sense amplifier drive signal line are arranged on a second layer of upper side.

3. A semiconductor memory device as set forth in claim 2, further comprising
 at least one power supply line arranged on a first layer of lower side different from the second layer and connected to the sense amplifier portions;
 a plurality of wirings, corresponding to the plurality of column selection lines, arranged on the first layer and connected to the column gate portions;
 means for electrically connecting the at least one power supply line to the sense amplifier drive signal line; and
 means for electrically connecting each of the plurality of wirings to a corresponding one of the plurality of column selection lines.

4. A semiconductor memory device as set forth in claim 3, wherein the power supply line and the plurality of wirings are arranged along a direction parallel to a direction of a shorter side of the semiconductor chip.

5. A semiconductor memory device as set forth in claim 3, wherein the region of the sense amplifier drive circuit and the region of the column decoder are arranged to lie opposite to each other with respect to a direction of a longer side of the semiconductor chip and provided in a rectangular form, respectively, along a direction parallel to a direction of a shorter side thereof.

6. A semiconductor memory device as set forth in claim 5, wherein the plurality of column selection lines and the sense amplifier drive signal line are arranged, respectively, along a direction parallel to the direction of the longer side of the semiconductor chip.

7. A semiconductor memory device as set forth in claim 6, wherein the sense amplifier drive signal line is formed having a width which enables a supply of a large amount of current.

8. A semiconductor memory device as set forth in claim 6, wherein the sense amplifier drive signal line and the plurality of column selection lines are formed by aluminum wiring, respectively.

9. A semiconductor memory device as set forth in claim 1, wherein the device has the form of a dynamic random access memory.

* * * * *